March 31, 1970 G. BOGNER ET AL 3,504,105

ELECTRICALLY CONDUCTIVE TAPE OF NORMALLY CONDUCTIVE METAL WITH A SUPERCONDUCTOR THEREIN

Filed June 20, 1968

United States Patent Office 3,504,105
Patented Mar. 31, 1970

3,504,105

ELECTRICALLY CONDUCTIVE TAPE OF NORMALLY CONDUCTIVE METAL WITH A SUPERCONDUCTOR THEREIN

Gunther Bogner and Richard Maier, Erlangen, Germany, assignors to Siemens Aktiengesellschaft, a corporation of Germany Filed June 20, 1968, Ser. No. 738,594
Claims priority, application Germany, June 24, 1967, S 61,470
Int. Cl. H01b 5/00
U.S. Cl. 174—126 11 Claims

ABSTRACT OF THE DISCLOSURE

An electrically conductive tape of normally conductive metal in which a superconductor is situated. The tape has a pair of tape portions of normally conductive metal respectively provided with faces directed toward each other. These faces are respectively formed with aligned longitudinally extending grooves which receive an elongated superconductor which is itself coated with a metal of normal conductivity. A solder metal of low melting point is situated between the tape portions at their faces which are directed toward each other and serves to solder the tape portions to each other and to the superconductor.

Figures 1, 2, 3, 4, 5:
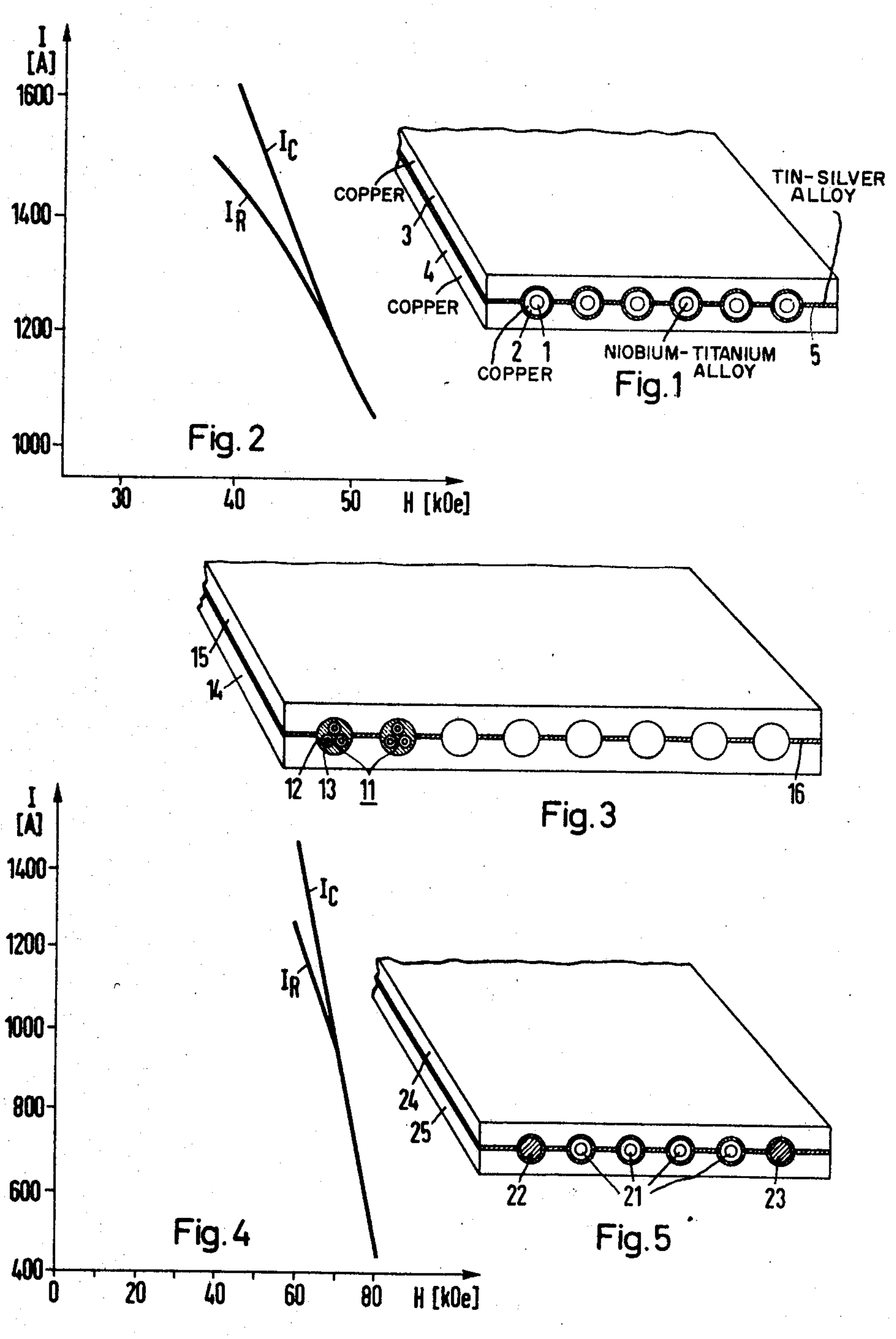

Our invention relates to electrically conductive tapes. In particular, our invention relates to electrically conductive tapes made of metal of normal conductivity having superconductors embedded therein.

In the construction of superconductive coils, particularly coils of large superconducting magnets, it is advantageous to use so-called stabilized conductors which include both superconducting metal and metal of good normal electrical conductivity at the operating temperature of the coil. In order to achieve a good electrical stability in the coil, which is to say particularly to avoid transition of all of the superconducting material in the coil from the superconducting to the normal conducting state during current overloads of short duration, the cross section and low-temperature conductivity of the normal conducting metal are selected so that the conductor, under conditions of good cooling, does not undergo any appreciable current degradation in the coil and so that upon transition of the superconductor in the critical condition from the superconducting to the normal conducting state as a result of a current in excess of the critical current, the current which flows through the superconductor is entirely or partly taken over by the metal of normal conductivity. In this way the transition of the superconductors from the superconducting to the normal conducting state can take place continuously and reversibly with the superconducting state being again achieved in response to a relatively small reduction in the current.

Conductors composed of superconducting and normal conducting metals are already known. With such conductors it is known to provide a plurality of parallel niobium-zirconium wires embedded in a copper tape. However, the embedding of the superconductive wires in the copper tape, which can be carried out by rolling the wires into the tape, makes it difficult to provide between the superconductive and normally conductive metals a good contact having the smallest possible transfer resistance between these metals. A low transfer resistance between the superconducting and the normal conducting metals is however highly desirable in order to make it possible to achieve a reversible current transfer between the superconductor and normal conductor. Moreover, during rolling of the superconductive wires into the copper tape there is a great danger that the copper will undergo a greater elongation than the mechanically harder superconductive metal and that, furthermore, the copper when worked during the rolling operations will receive a rolling texture. Such texturing results in an increase in the residual resistance of the copper at low temperatures, so that the result is a reduction in the electrical conductivity of the copper and thus a deterioration of the stabilizing action.

There are also known tape conductors of superconductive and normally conductive metal where a plurality of superconductive wires are simultaneously embedded in and surrounded by metal of normal conductivity in an extrusion process. However, such conductors are difficult to manufacture in long lengths since the extrusion of metal of normal conductivity occasionally pulls or tears away during extrusion.

Conductors are also known where a single tape of metal of normal conductivity is provided at an exterior surface with longitudinally extending grooves. In these grooves there are a plurality of superconductive wires which are coated with metal of normal conductivity and which are fixed to the tape by placing the edges of the grooves around the superconductive wires. In order to achieve an electrical contact between the tape of normal conductivity and the superconductive wires, this conductor is tempered so that the metal of the normally conductive tape and the metal of the normally conductive coating on the wires diffuse into each other. Such a conductor has the disadvantage of requiring a relatively high tempering temperature which generally is in excess of 400° C. Such high temperatures have a deleterious effect on the superconducting properties of the superconductors.

It is a primary object of our invention to provide a tape conductor which can be manufactured in a simple manner while avoiding the above drawbacks and which in particular can be manufactured in long lengths without encountering any problems.

In particular, it is an object of our invention to provide a tape conductor which can be readily manufactured at a relatively high speed in long lengths while maintaining extremely low resistances at the regions where the superconductive and normally conductive metals join each other.

In accordance with our invention the tape includes at pair of tape portions of normally conductive metal respectively having faces directed toward each other and respectively formed with longitudinally extending grooves which are aligned with each other. At least one elongated superconductor which is coated with a metal of normal conductivity is situated in these grooves. A solder metal of low melting point is situated between the tape portions at their grooved faces and serves to solder the tape portions to each other and to the superconductor.

In a preferred construction of a tape conductor according to our invention each tape portion is formed at its face which is directed toward the other tape portion with a plurality of longitudinally extending parallel grooves, and the grooves of one tape portion are respectively aligned with the grooves of the other tape portion so as to form pairs of aligned grooves. A plurality of superconductors are respectively situated in these pairs of aligned grooves so as to be situated in this way between the tape portions which are of normally conductive metal. This construction has a number of advantages. Thus, during a temporary current overload in one superconductor, part of the current can flow through the normally conductive metal to a parallel superconductor. Moreover, the contact or transfer resistance between the superconductors and the normally conductive metal tape portions is reduced because of the increase in the contact area between the superconductors and the tape portions.

Wire superconductors are particularly suitable for use in the tape of our invention. Instead of individual superconductive wires of relatively large cross section it is also advantageous to use cabled wires as superconductors. Such cabled wires are each made up of a plurality of thin superconductive wires which are twisted together and which are coated with a metal of normal conductivity. With this construction, when the conductor is to be subjected to relatively large current loads, it is possible to make use of the higher critical current density of the thin superconductive wires which are suited for such higher critical current densities, as contrasted with thicker wires, by reason of the more intense cold-working which these thinner wires undergo during their manufacture. These factors are particularly applicable to high-field superconductors made of superconductive alloys.

In some cases very large mechanical forces are encountered in the windings of superconductive coils for which the tape conductors of our invention are particularly suitable. In view of such large mechanical forces, it is further of advantage to construct the tape conductor of our invention so that there are situated between the tape portions in the grooves thereof not only superconductors but also one of more wires of high mechanical strength and made of metal of normal electrical conductivity, such wires of high mechanical strength being preferably soldered also to the tape portions. By using such wires of high mechanical strength, the mechanical strength of the entire tape conductor of our invention can be substantially increased.

The tape portions of the normal electrically conductive metal of the tape conductor of our invention can be made of all metals of good conductivity which are capable of being soldered, and preferably these tape portions are made of copper, particularly a copper of high purity.

The superconductors of the tape conductor of our invention may be made, particularly in the case of high-field superconductors, of a superconductive alloy of niobium-zirconium or niobium-titanium. These alloys may be, in particular, an alloy of niobium-zirconium having a zirconium content of 25–50% by weight and an alloy of niobium-titanium having a titanium content of between 40% and 70% by weight. The coating of normal conductivity which covers these superconductors can in particular be a metal such as copper, silver, or gold. Copper, however, is in general preferred.

In order to maintain the electrical contact resistance between the normally conductive coatings of the superconductors and the normally conductive tape portions as small as possible and in order to avoid unnecessary heating of the tape during soldering, a solder metal is used which preferably is a metal of good electrical conductivity having a melting point which is less than 400° C. Suitable soldering metals for this purpose are in particular tin, indium, or lead, or suitable alloys of tin and silver, of tin and indium, or tin and lead. For example a suitable alloy is composed of tin and approximately 6% by weight of silver having a melting point of approximately 250° C., or an alloy of tin and 3.5% by weight of silver with a melting point of approximately 220° C. Also, an alloy of tin with 48% by weight of lead with a similar low melting point is suitable.

In the case of a tape conductor which is provided with wires of high mechanical strength, such wires are preferably of a high-quality steel. When such wires are soldered with the tape portions of normal conductivity, they are advantageously provided with a copper coating.

The tape conductor of our invention has a number of advantages. Thus, by reason of the soldering, an extremely low contact resistance between the metal coatings of normal conductivity which cover the superconductors and the tape portions of normal electrical conductivity is achieved, so that the normally conductive tape portions have an outstanding electrical stabilizing effect. Moreover, the superconductors of the tape of our invention are situated in a central plane of the finished tape, which is to say in a neutral plane which is neither tensioned or compressed during bending of the tape so that that upon winding of a coil from the tape conductor of our invention the superconductors are subjected to extremely small bending stresses. Before assembly of the components of the tape conductor of our invention, the individual elements thereof independently undergo the required working operations. Thus, the separate elements of the tape are worked separately from each other. In particular, the tape portions of normal conductivity can be worked without cutting so that there is no loss of material when these tape portions are formed with the longitudinal grooves for receiving the superconductors. Before the components of the tape conductor of our invention are assembled, the grooved normally conductive tape portions can undergo an additional annealing, so that any roll texturing encountered during formation of the grooves can be cured out and the residual resistance of the normal conducting material of the tape portions is reduced. With copper tapes this soft annealing takes place approximately at temperatures which are between 200 and 500° C., preferably between 300 and 350° C., and the duration of the annealing is approximately one hour, while the annealing is carried out in an evacuated atmosphere or in a protective gas atmosphere. Then the tape portions of normal conductivity are permitted to cool slowly. Inasmuch as the superconductors have not yet been joined to these normally conducting tape portions during the annealing thereof, the superconducting properties of the superconductors cannot be undesirably influenced by the annealing. The finishing of the tape conductor of our invention is relatively simple, so that long lengths can be manufactured in a short time.

Our invention is illustrated by way of example in the accompanying drawings which form part of our application and in which:

FIG. 1 is a fragmentary perspective schematic illustration of one example of a tape conductor of our invention having a plurality of wire superconductors;

FIG. 2 graphically illustrates the current-carrying capacity of the conductor of FIG. 1 with respect to an exterior magnetic field;

FIG. 3 is a fragmentary perspective schematic illustration of another embodiment of a tape conductor according to our invention where the superconductors are in the form of a plurality of cabled wires;

FIG. 4 graphically illustrates the current-carrying capacity of the conductor of FIG. 3 with respect to an exterior magnetic field; and FIG. 5 is a fragmentary perspective schematic illustration of a further embodiment of a tape conductor of our invention where in addition to superconductive wires there are also wires of high mechanical strength.

The tape conductor of our invention which is illustrated in FIG. 1 is provided with six super conductive wires 1 each made of an alloy of 35% niobium by weight and 65% titanium by weight, these superconductive wires being covered with a metallurgically deposited copper coating 2. These wires 1 are situated between a pair of tape portions 3 and 4 which respectively have faces directed toward each other and formed with grooves which receive the superconductors. Thus, the grooves in each of the tape portions are parallel to each other and extend longitudinally of the tape portion with the grooves of one tape portion respectively aligned with the grooves of the other tape portion to form therewith pairs of aligned grooves which respectively receive the superconductors. The tape portions 3 and 4 are made of copper and are soldered to each other and to the superconductors by way of a solder metal 5 which is situated between the tape portions 3 and 4 at the grooved faces thereof. The solder metal in the illustrated example is made of an alloy of 96.5% tin, by weight, and 3.5% by weight of silver. This alloy has a melting point of 220° C. Each of the wire superconductors has, including its copper coating, a total diameter of 0.91 mm. The entire tape conductor has, with tape portions 3 and 4 of equal thickness, a total thickness of 1.6 mm. and a width of 10 mm. The grooves formed in both of the tape portions are all of the same depth, so that the superconductors are situated in a central plane midway between the exterior opposed faces of the tape.

FIG. 2 illustrates the behavior of the tape conductor of FIG. 1 when loaded with current in an exterior magnetic field. The current I is indicated at the ordinate in amperes, while the exterior magnetic field H is shown at the abscissa in kilo-oersteds. During the measurements, one of the exterior wide side surfaces of the tape of FIG. 1 was covered with a plastic tape, so that only 50% of the exterior surface of the tape conductor was directly in heat-exchanging relationship with the liquid helium which was used for cooling purposes. The outer magnetic field was directed perpendicularly with respect to the superconductors 1 and parallel to the opposed faces of the tape, only the upper face thereof being visible in FIG. 1. Thus, the exterior magnetic field was directed horizontally as viewed in FIG. 1.

The curve $I_c$ of FIG. 2 indicates the so-called critical current of the conductor. If, in a given magnetic field, the current load of the tape conductor is increased, then starting at this critical current part of the current which flows through the superconductors is transferred into the tape portions of normal conductivity. Upon a reduction in current load, the current returns reversibly again into the superconductors. The curve $I_R$ indicates the current intensity for a given exterior magnetic field in the case where the entire current again flows in the superconductors. Thus, for example, in a magnetic field of 45 kilo-oersteds the current, at an intensity of 1350 amperes, will start to transfer out of the superconductors into the normally conducting tape portions. If the current intensity is reduced to 1320 amperes, then the entire current again flows in the superconductors. The curves of FIG. 2 clearly illustrate that the tape conductor of FIG. 1 is still capable of operating in magnetic fields of 50 kilo-oersteds at current intensities of 1100 amperes.

In making the measurements to achieve the curves of FIG. 2, the current was directed to the tape conductor through copper clamping jaws between which the conductor was clamped. A more accurate test indicated that the current beneath the copper clamping jaws had already moved completely out of the normally conducting tape portions and into the superconducting wires. The contact resistance between the copper tape portions of the tape conductor and the superconductors thus was so small that it could be considered as of nearly zero value.

The tape conductor of our invention which is illustrated in FIG. 3 is provided with eight cabled superconductors 11 each of which is composed of three superconductive wires 13 twisted together and covered with a copper coating 12. These cabled superconductor wires 11 are situated in the pairs of aligned longitudinally extending grooves formed in the copper tape portions 14 and 15 at the faces thereof which are directed toward each other, as indicated in FIG. 3. The individual superconductive wires 13 are also made in this case of an alloy of 35% by weight of niobium and 63% by weight of titanium. Each cabled wire 11 has, including its copper coating, a diameter of approximately 0.5 mm. The copper tape portions 14 and 15 are of equal thickness and each have a width of 10 mm. The total thickness of the complete tape conductor is 1.6 mm. The tape portions 14 and 15 are soldered to each other and to the superconductor 11 by a metal solder 16 which also is an alloy of 96.5% tin and 3.5% silver.

FIG. 4 illustrates the behavior of the tape conductor of FIG. 3 under a current load with respect to and exterior magnetic field. The curves $I_c$ and $I_R$ of FIG. 4 have the same significance as the corresponding curves of FIG. 2. From FIG. 4 it is apparent that the tape conductor of FIG. 3 can be loaded with a substantially higher current than the tape conductor of FIG. 1. Thus, for example, the tape conductor of FIG. 3 can still be loaded in an exterior field of 65 kilo-oersteds with a current of 1100 amperes.

FIG. 5 illustrates a tape conductor of our invention where in addition to four copper-coated superconductors 21, there are a pair of wires 22 and 23 made of high-quality steel for increasing the mechanical strength. These wires 22 and 23 are situated in the outer pairs of aligned grooves of the tape portions 24 and 25 which are also made of copper. Except for this difference the construction of FIG. 5 corresponds to that of FIG. 1.

The following example relates to the manufacture of a tape conductor as illustrated in FIG. 1. Initially the copper tape portions 3 and 4 are subjected to the pressure of a roll of suitably toothed profile so as to have the longitudinal grooves which receive the wire superconductors pressed into these tape portions. In order to achieve in the tape portions a microstructure which is as uniform as possible, the rolling operations are advantageously carried out in a plurality of steps, such as two steps, for example. After the first pass through the groove-forming rolls, the copper tapes may advantageously be annealed at a temperature of between 200 and 500° C. Then the copper tape portions are rolled a second time to achieve their final grooved configuration, and thereafter they are again subjected to a soft annealing at a temperature of between 200 and 500° C., preferably between 300 and 350° C., for a duration of approximately one hour in an evacuated atmosphere or in a protective gas atmosphere. After the annealing, the tape portions are permitted to cool slowly. As a result of this soft annealing the electrical residual resistance of the tape portions is reduced. After the annealing operations are completed, oxide layers are removed for example by brushes which are applied to the tape portions, and a layer of solder metal is then deposited on the grooved faces of the tape portions where the tape portions are to be joined together. This application of the layer of soldering metal can take place by way of a so-called swelling process where the tapes are guided over a swelling region of molten solder metal. In some cases the tape portions can be covered at their entire exterior surfaces with the layer of solder metal, for example by immersing the copper tape portions into the liquid solder metal.

In order to prepare the superconductive wires for the manufacture of the tape conductor of our invention, the oxide layers on the copper coatings 2 are initially removed, for example by etching. Then these wires are provided with a solder metal exterior layer as, for example, by immersing the wires in liquid solder metal.

During the actual assembly of the components to manufacture the tape conductor of our invention, the pair of tape portions 3 and 4 of normal conductivity and the wires 1 are unrolled from separate supply rolls. Then the wires 1 are situated within the longitudinal grooves of the copper tape portion 4, whereupon the copper tape portion 3 is placed over the copper tape portion 4 and the wires 1 thereon. The thus-assembled conductor is then drawn, for example, through heated soldering blocks which are heated to the melting temperature of the solder metal, and these blocks also serve to compress the assembly somewhat. The soldering operations take place at a relatively high speed, so that the tape conductor moves through the soldering blocks at a speed, for example, of 8–10 cm. per second. The finished tape conductor is then drawn through cooling blocks, which are water-cooled, so that in this way the conductor is cooled. Then it is wound onto a suitable supply roll, for example.

The above-described manufacturing process is exceedingly simple and enables extremely long lengths of the tape conductors of our invention to be continuously manufactured in a single operation.

We claim:

1. An electrically conductive tape comprising a pair of tape portions of metal normally conductive at a given temperature respectively having faces directed toward each other and respectively formed in said faces with aligned grooves extending longitudinally of said tape portions, an elongated member of material superconductive at said given temperature coated with a metal normally conductive at said given temperature and situated in said aligned grooves between said tape portions, and a solder metal of low melting point situated between said tape portions at said faces thereof and soldering said tape portions to each other and to said coated member, said faces of said tape portions being respectively formed with additional longitudinally extended grooves aligned with each other, and at least one mechanically strong wire of metal normally conductive at said given temperature being situated in said additional grooves between said tape portions.

2. The combination of claim 1 and wherein each of said faces of said tape portions is formed with a plurality of said grooves extending parallel to each other with the grooves in one of the said faces respectively aligned with the grooves in the other of said faces to form a plurality of pairs of aligned grooves, and a plurality of said superconductors being respectively situated in said plurality of pairs of aligned grooves.

3. The combination of claim 1 and wherein said superconductor is in the form of a wire.

4. The combination of claim 1 and wherein said elongated member is in the form of a cabled wire having a plurality of thin wires superconductive at said given temperature twisted together and covered with said coating of metal normally conductive at said given temperatures.

5. The combination of claim 1 and wherein said tape portions are made of copper.

6. The combination of claim 1 and wherein said elongated member is made of an alloy selected from the group consisting of an alloy of niobium and zirconium and an alloy of niobium and titanium.

7. The combination of claim 1 and wherein the coating of said elongated member is selected from the group consisting of copper, silver, and gold.

8. The combination of claim 1 and wherein said solder metal is a metal of good electrical conductivity having a melting point of less than 400° C.

9. The combination of claim 8 and wherein said solder metal is selected from the group consisting of tin, indium, or lead.

10. The combination of claim 8 and wherein said solder metal is an alloy selected from the group consisting of an alloy of tin and silver, an alloy of tin and indium, and an alloy of tin and lead.

11. The combination of claim 1 and wherein said mechanically strong wire of metal normally conductive at said given temperature is made of a high quality steel of high mechanical strength.

References Cited

UNITED STATES PATENTS

| | | | |
|---|---|---|---|
| 296,074 | 4/1884 | Shaw | 29—474.4 |
| 334,850 | 1/1886 | Denison. | |
| 3,306,972 | 2/1967 | Laverick | 174—128 X |
| 3,309,179 | 3/1967 | Fairbanks. | |
| 3,366,728 | 1/1968 | Garwin. | |

E. A. GOLDBERG, Primary Examiner

U.S. Cl. X.R.

174—117; 335—216